US009461604B2

(12) United States Patent
Matsumura

(10) Patent No.: US 9,461,604 B2
(45) Date of Patent: Oct. 4, 2016

(54) SOUND OUTPUT DEVICE AND METHOD OF ADJUSTING SOUND VOLUME

(71) Applicant: FUNAI ELECTRIC CO., LTD., Osaka (JP)

(72) Inventor: Akifumi Matsumura, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 468 days.

(21) Appl. No.: 13/680,475

(22) Filed: Nov. 19, 2012

(65) Prior Publication Data

US 2013/0156227 A1 Jun. 20, 2013

(30) Foreign Application Priority Data

Dec. 15, 2011 (JP) ................................ 2011-274575

(51) Int. Cl.
*H03G 3/00* (2006.01)
*H03G 3/20* (2006.01)
*H03G 7/00* (2006.01)

(52) U.S. Cl.
CPC ............... *H03G 3/20* (2013.01); *H03G 7/007* (2013.01)

(58) Field of Classification Search
CPC ........ H03G 7/00; H03G 7/001; H03G 7/002; H03G 7/007; H03G 3/20
USPC ......... 381/56, 58, 94.2, 94.3, 102, 104, 106, 381/107, 320, 321
See application file for complete search history.

(56) References Cited

U.S. PATENT DOCUMENTS

| | | | | |
|---|---|---|---|---|
| 4,342,059 A | * | 7/1982 | Wray | ........................ 360/123.01 |
| 5,450,624 A | * | 9/1995 | Porambo et al. | .......... 455/226.4 |
| 7,149,068 B2 | * | 12/2006 | Adragna | .................. H02M 1/36 |
| | | | | 323/901 |
| 2004/0178852 A1 | * | 9/2004 | Neunaber | ...................... 330/284 |
| 2007/0036362 A1 | | 2/2007 | Chiu et al. | |
| 2008/0200133 A1 | * | 8/2008 | Nagatani | ................ H04B 1/707 |
| | | | | 455/91 |
| 2009/0016547 A1 | * | 1/2009 | Aoki | ........................ H03G 3/02 |
| | | | | 381/107 |

(Continued)

FOREIGN PATENT DOCUMENTS

JP   2002-198756 A      7/2002
JP       02-198756   *  12/2002

(Continued)

OTHER PUBLICATIONS

Extended European Search Report dated Nov. 29, 2013 for corresponding EP Application No. 12194512.5.

(Continued)

*Primary Examiner* — Vivian Chin
*Assistant Examiner* — Wailliam A Jerez Lora
(74) *Attorney, Agent, or Firm* — Morgan, Lewis & Bockius LLP

(57) ABSTRACT

A sound output device of the present invention is one that receives a digital audio signal including a plurality of channels and performs digital signal processing on the received digital audio signal, and includes a detecting portion which detects peak values or effective values of the plurality of channels included in the digital audio signal. The sound output device also includes an electric power calculating portion which calculates necessary electric power to output sound of each of the channels according to the peak values or the effective values. The sound output device also includes a sound volume adjusting portion which adjusts sound volume of the digital audio signal according to a total of the necessary electric power calculated by the electric power calculating portion for each of the channels.

14 Claims, 5 Drawing Sheets

(56) References Cited

U.S. PATENT DOCUMENTS

2009/0245539 A1* 10/2009 Vaudrey et al. .............. 381/109
2010/0061566 A1* 3/2010 Moon .................... H03G 7/007
                                                                                                           381/71.8

FOREIGN PATENT DOCUMENTS

| JP | 2002-198756 | * | 12/2002 |
| JP | 2006-340328 A | | 12/2006 |
| JP | 2007-053721 | | 3/2007 |
| JP | 2008-306491 A | | 12/2008 |
| JP | 2010-045481 | | 2/2010 |
| JP | 2011-023937 | | 2/2011 |

OTHER PUBLICATIONS

Japanese Office Action dated Dec. 16, 2014 for corresponding Patent Application No. JP 2011-274575.

* cited by examiner

FIG.4

| ITEM | CALCULATING FORMULA/VALUE | UNIT |
|---|---|---|
| MAX OUTPUT ELECTRIC POWER LIMIT_A | LIMIT_A | W |
| SPEAKER IMPEDANCE Sohm | Sohm | Ω |
| MAXIMUM VOLTAGE LEVEL Vmax | $\sqrt{LIMIT\_A \times Sohm}$ | Vrms |
| PEAK VOLTAGE Vpeak | Vmax × $\sqrt{2}$ | V |
| FULL SPANPK-PK Vpk-pk | Vpeak × 2 | V |
| VOLTAGE VALUE PER BIT Vbit | VPK-PK/2^QUANTIZATION INDEX | V |
| VALUE CALCULATED BASED ON DETECTED VALUE | | |
| EX.) VOLTAGE VALUE AT DETECTION LEVEL Vd | DETECTED VALUE × Vbit | V |
| EFFECTIVE VALUE VOLTAGE ON DETECTION Vdrms | (Vd−Vpeak)/$\sqrt{2}$ | Vrms |
| THEORETICAL ELECTRIC-POWER VALUE ON DETECTION Wd | Vdrms^2/Sohm | W |

FIG.5

| ITEM | CALCULATING FORMULA/VALUE | UNIT |
|---|---|---|
| MAX OUTPUT ELECTRIC POWER LIMIT_A | LIMIT_A | W |
| SPEAKER IMPEDANCE Sohm | Sohm | Ω |
| MAXIMUM VOLTAGE LEVEL Vmax | $\sqrt{(LIMIT\_A \times Sohm)}$ | Vrms |
| VALUE X OF RMS DETECTOR WHEN VMAX | x | |
| VARIATION RATE PER VALUE OF RMS DETECTOR Vv | Vmax/x | V |
| VALUE CALCULATED BASED ON DETECTED VALUE | | |
| EX.) VOLTAGE VALUE AT DETECTION LEVEL k | k | V |
| DETECTED THEORETICAL VOLTAGE EFFECTIVE VALUE Vdrms | k × Vv | Vrms |
| THEORETICAL ELECTRIC-POWER VALUE ON DETECTION Wd | Vdrms^2/Sohm | W |

SOUND OUTPUT DEVICE AND METHOD OF ADJUSTING SOUND VOLUME

This application is based on Japanese Patent Application No. 2011-274575 filed on Dec. 15, 2011, the contents of which are hereby incorporated by reference.

BACKGROUND OF THE INVENTION

1. Field of the Invention

The present invention relates to a sound output device that is used to output sound, and specifically relates to one that is equipped with a multichannel output. The present invention also relates to a method of adjusting sound volume.

2. Description of Related Art

In recent years, the development of multifunctional digital sound has led to a wide use of sound output devices equipped with a multichannel output such as a 5.1-channel output.

As an example of such sound output devices, assume, for example, that there is a 5.1-channel output model on which is written "MAX 100 W/ch" regarding its output. In this case, it is usually understood that the maximum total of outputs of all the channels is 100 W×6=600 W, but the sound output device may not actually have power supply ability that is high enough to drive 5.1 channels simultaneously to their maximum output levels. This tendency is evident particularly in low-cost sound amplifiers.

This is because specifications of such low-cost sound amplifiers are decided and set in view of: the fact that only a small number of actual sound generator sources are configured to fully drive all the channels simultaneously; and achieving low power supply cost. However, in a case of a device whose power supply ability is extremely reduced, if a sound generator source configured such that all the channels are nearly fully driven is reproduced in 5.1 channels with a great volume, the allowable output of the power supply will be exceeded, and the power supply may be destroyed.

For example, assume that the allowable input of the power supply is 100 W, which barely satisfies 100 W/ch. Here, if a 5.1-channel source is fully driven to be reproduced with the maximum volume, the inputted power supply is significantly smaller than 600 W which is required. In this case, various devices forming the power supply are destroyed.

In an effort to overcome the above problem, there has been disclosed and proposed a device where the allowable output of the power supply is small and the power supply is equipped with a constant power control voltage drooping characteristic (a chevron-shaped, or a mouth-turned-down-at-the-two-corners shaped, characteristic) and a device that monitors the output volume (see, for example, Patent Literatures 1 to 3).

[Patent Literature 1] JP-A-2011-23937
[Patent Literature 2] JP-A-2010-45481
[Patent Literature 3] JP-A-2007-53721

However, in the technology used in Patent Literatures listed above, detection/control of electric power and output volume is achieved by using an analog device (for example, a converter or a current detecting circuit). Such a device configuration is prone to be complex.

In particular, in the case where control is performed by using the constant power control voltage drooping characteristic, it is necessary to provide a circuit configuration that detects and feedbacks current increase, which is likely to lead to a cost increase. Furthermore, when indicated in a graph, the current itself continues to increase greatly even in the chevron-shaped portion in the graph, it is necessary to design such that a device on the power supply secondary side has a large allowable current.

Furthermore, in the case of using the constant power control voltage drooping characteristic, in a portion after the chevron-shaped portion, if a sound signal whose load varies in a complicated manner is driven, the linearity of the power-supply voltage is lost, which may invite degradation of the sound quality.

SUMMARY OF THE INVENTION

The present invention has been made in view of the above, and aims at providing a sound output device that is capable of performing sound output avoiding destruction thereof even when the output sound volume rises extremely, and moreover, does not need volume adjustment by using an analog device, and providing a method of adjusting sound volume.

To achieve the above object, according to an aspect of the present invention, a sound output device, which receives a digital audio signal including a plurality of channels and performs digital signal processing on the received digital audio signal, includes a detecting portion which detects peak values or effective values of the plurality of channels included in the digital audio signal, an electric power calculating portion which calculates necessary electric power to output sound of each of the channels according to the peak values or the effective values, and a sound volume adjusting portion which adjusts sound volume of the digital audio signal according to a total of the necessary electric power calculated by the electric power calculating portion for each of the channels.

According to a preferable embodiment of the present invention, the sound output device further includes a compressing portion which performs compression of a dynamic range of a digital audio signal, and a discriminating portion which discriminates a largest peak value or a largest effective value of the peak values or the effective values of the plurality of channels. Here, the sound volume adjusting portion compares the peak value or the effective value discriminated by the discriminating portion with a predetermined threshold, and if the peak value or the effective value exceeds the threshold, the sound volume adjusting portion instructs the compressing portion to perform the compression.

To achieve the above object, according to a preferable embodiment of the present invention, the sound output device further includes a threshold recording portion having recorded therein: a first threshold indicating an allowable output electric power of a power supply incorporated in the sound output device; and a second threshold indicating a limit of a range of power under which the power supply is protected in a case of a complete short circuit of the power supply. Here, the sound volume adjusting portion instructs the compressing portion to perform the compression if the total exceeds the first threshold but does not exceed the second threshold.

To achieve the above object, according to a preferable embodiment of the present invention, the sound output device further includes a mute portion which performs muting of a digital audio signal. Here, if the total exceeds the second threshold, the sound volume adjusting portion instructs the mute portion to perform muting of a digital signal and instructs the compressing portion to perform the compression, and after the compression is completed, the sound volume adjusting portion instructs the mute portion to cancel the muting.

To achieve the above object, according to a preferable embodiment of the present invention, in instructing the compressing portion to perform the compression, the sound volume adjusting portion instructs the compressing portion to find a maximum value of the peak or effective values of the plurality of channels detected by the detecting portion, to calculate a degree of attenuation between the maximum value and a maximum value previously set according to a standard of the digital audio signal, and to perform the compression based on a value obtained by attenuating the degree of attenuation by a predetermined degree.

To achieve the above object, according to a preferable embodiment of the present invention, if the total still exceeds the first threshold after the sound volume adjusting portion instructs the compressing portion to perform the compression, the sound volume adjusting portion instructs the compressing portion to perform the compression with a further increased degree of attenuation, and the sound volume adjusting portion instructs the compressing portion to stop the compression at an instant when a time period during which the total is larger than the first threshold exceeds a predetermined time length.

To achieve the above object, according to a preferable embodiment of the present invention, the sound output device further includes an audio decoder which decodes encoded audio data to generate a digital audio signal, and an amplifier which amplifies sound.

To achieve the above object, according to another aspect of the present invention, a sound volume adjusting method for adjusting volume of sound output from a sound output device includes the steps of performing compression of a dynamic range of a digital audio signal, finding a maximum value of peak values or effective values of a plurality of channels included in the digital audio signal, comparing the maximum value of the peak values or the effective values with a predetermined threshold, and performing the compression if the maximum value of the peak values or the effective values exceeds the threshold.

As described above, according to the present invention, even when the output sound volume is raised with a power supply having a small allowable output power, it is possible to continue the sound output. Furthermore, there is no need of providing an analog device such as a feedback circuit as in a case where control is performed by making use of the constant power control voltage drooping characteristic, and this is advantageous in terms of achieving a simple power supply configuration and reduction of cost. Moreover, the amount of electric current itself is reduced in a multichannel drive, and this makes it possible to reduce the allowable current of the power supply.

BRIEF DESCRIPTION OF THE DRAWINGS

FIG. 4 is a schematic diagram showing theoretical value calculation methods where a peak value is used; and FIG. 5 is a schematic diagram showing theoretical value calculation methods where an effective value is used.

DESCRIPTION OF THE PREFERRED EMBODIMENTS

Hereinafter, embodiments of the present invention will be described with reference to the accompanying drawings. Note that the embodiments herein are merely illustrative and the present invention is not limited to these embodiments.

<1. Inner Configuration>

Figure 1:
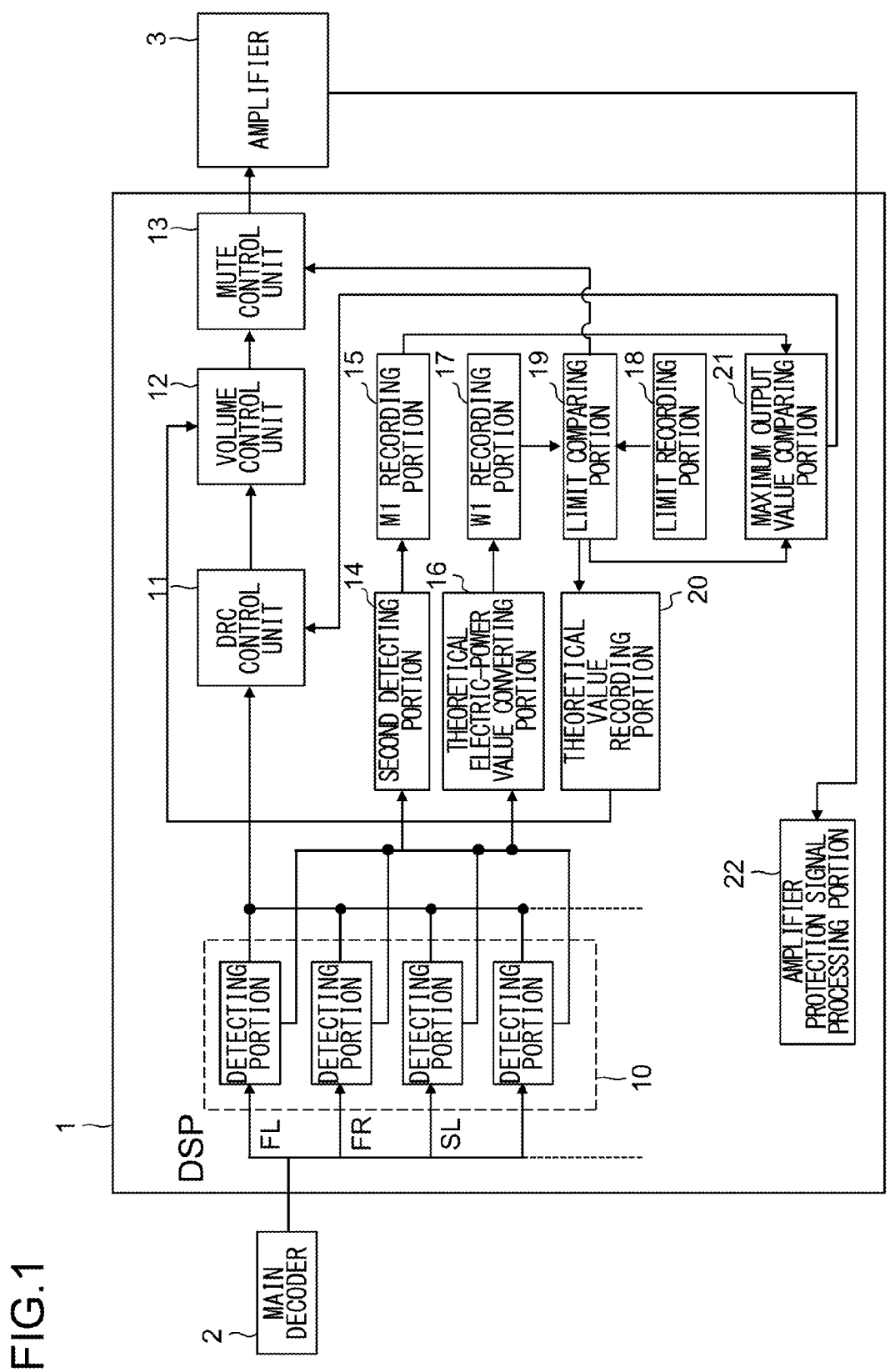
FIG. 1 is a block diagram showing the inner configuration of a sound output device of the present invention.

FIG. 1 is a block diagram showing part of the inner configuration of a sound output device according to an embodiment of the present invention. This sound output device includes at least a DSP 1 (=a control portion), a main decoder 2 (=an audio decoder), and an amplifier 3. Incidentally, an unillustrated speaker is provided as a device connected to the amplifier 3.

The DSP (Digital Signal Processor) 1 receives, for example, an I2C signal and performs digital audio processing thereon to output the processed signal to the amplifier 3. The DSP 1 is also equipped with a function of receiving an amplifier protection signal from the amplifier 3 to adjust the output level of an audio signal according to the signal. The DSP 1 is further provided with function portions such as a detecting portion 10 and the like which are achieved by executing a predetermined program on an arithmetic processing unit incorporated in the DSP1. Descriptions of the detecting portion 10 will be given later.

The main decoder 2 decodes audio data encoded according to an encoding system such as MPEG, to thereby produce a digital audio signal such as an I2C signal. The resulting digital audio signal is fed to the DSP 1.

The amplifier 3 amplifies sound to a level at which the sound is able to be outputted to the unillustrated speaker. The amplifier 3 is also equipped with a function of monitoring its own condition and outputting the amplifier protection signal to the DSP 1 if over-power and/or over-heat of the amplifier 3 is detected.

<2. Function Configuration of DSP>

Next, a description will be given of a relationship between the functional portions provided in the DSP 1 according to an embodiment of the present invention for achieving multichannel output sound adjustment, with reference to the block diagram of FIG. 1.

As shown in FIG. 1, the DSP 1 includes a detecting portion 10, a DRC control unit 11 (=a compressing portion), a volume control unit 12 (=a sound volume adjusting portion), a mute control unit 13 (=a mute portion), a second detecting portion 14 (=a discriminating portion), an M1 recording portion 15, a theoretical electric-power value converting portion 16 (=an electric-power calculating portion), a W1 recording portion 17, a limit recording portion 18 (=a threshold recording portion), a limit comparing portion 19 (=a sound volume adjusting portion), a theoretical value recording portion 20, a maximum output value comparing portion 21 (=a sound volume adjusting portion), and an amplifier protection signal processing portion 22.

The detecting portion 10 detects a peak value or an effective value of each channel included in a digital audio signal. The detecting portion 10 of the present embodiment includes a plurality of detecting portions which each detect a peak value or an effective value of a channel.

The DRC control unit 11 compresses over power of the digital audio signal. The volume control unit 12 controls the output volume of the digital audio signal. The mute control unit 13 stops the output of the digital audio signal.

The second detecting portion 14 detects the largest peak value or the largest effective value among the peak values or the effective values of all the channels detected by the detecting portion 10. Then the second detecting portion 14 records the thus detected value M1 in the M1 recording portion 15.

The theoretical electric-power value converting portion 16 calculates the output electric power necessary to output a sound of each channel based on the peak value or the effective value of each channel detected by the detecting portion 10. Then, the theoretical electric-power value converting portion 16 calculates W1, which is a value obtained by adding up the output electric power of all the channels calculated above, and records the thus calculated W1 in the recording portion 17.

The limit recording portion 18 is a recording medium where the following two values are recorded, namely, a limit A (=a first threshold), which is a value that indicates an allowable output electric power of a power supply, and a value that indicates power indicative that the power supply is completely short circuited from which the power supply needs to be protected, that is, a limit B (=a second threshold) which is a protecting-the-power-supply-from-complete-short-circuit level at which the power supply is regarded as being completely short-circuited and needing protection from the complete short circuit. These two values are assumed to be known from the design and measurement of the sound output device. The limit A is, however, assumed to be an output level that allows the power supply to maintain a stable-voltage state (a state where an intended constant voltage is able to be outputted maintaining linearity).

The limit comparing portion 19 compares the limit A or the limit B with W1. And, the limit comparing portion 19 controls ON/OFF of the mute control unit 13 based on the comparison result.

The theoretical value recording portion 20 is the recording medium where a theoretical output-limit value is recorded. The theoretical output-limit value is a value indicating an attenuation rate to be applied to the peak value or the effective value to obtain an output by (100 W×M)/the number of channels (M is a constant determined with consideration given to an amplifier effect), when the allowable output power is 100 W, for example.

The maximum output value comparing portion 21 performs comparison between M1 and the maximum output value of the DSP 1. Then, based on the comparison result, control of the DRC control unit 11 is performed.

The amplifier protection signal processing portion 22 receives the amplifier protection signal from the amplifier 3, and monitors the state of the amplifier 3.

<3. Sound Volume Adjusting Processing>

Figure 2:
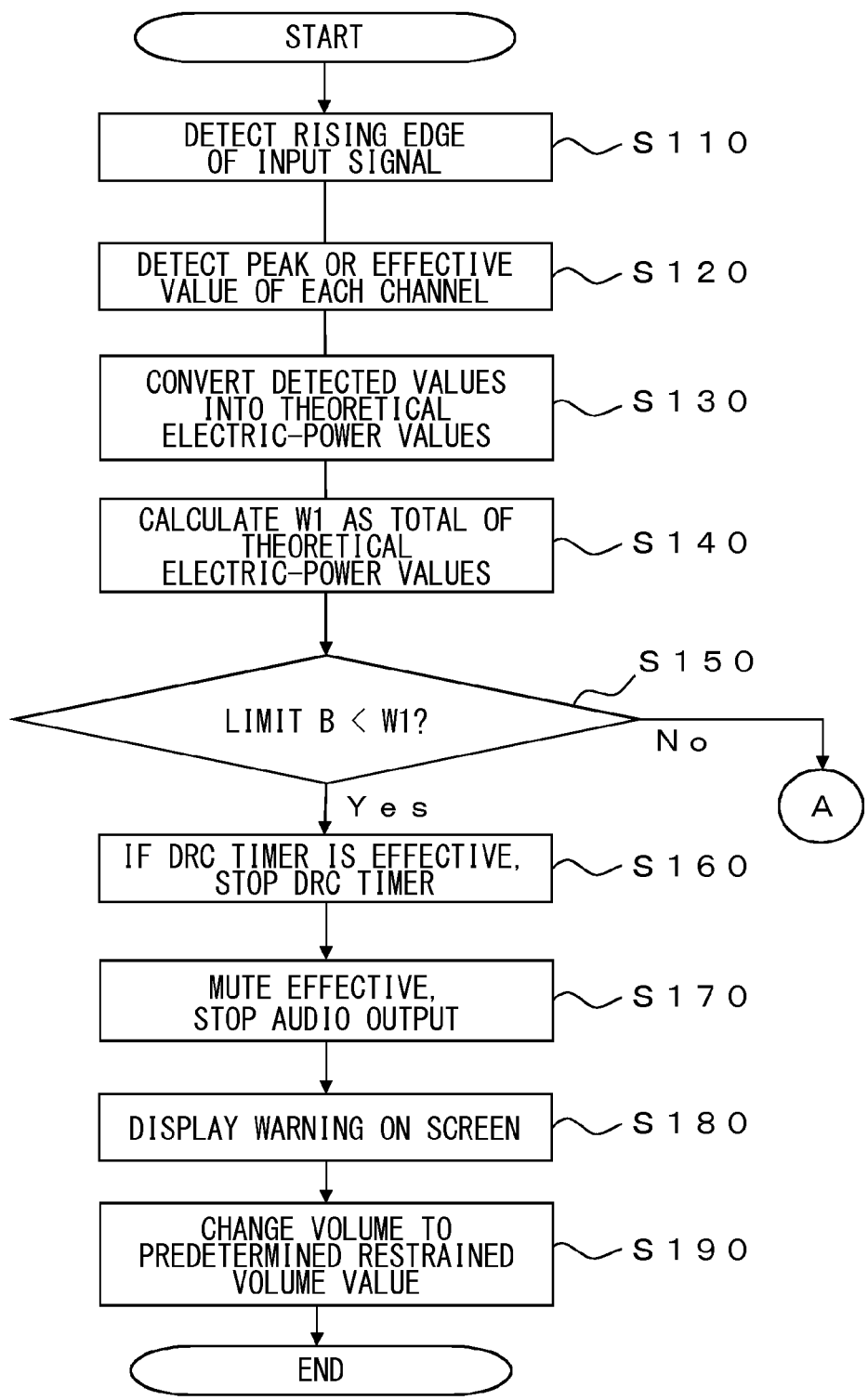
FIG. 2 is a flow chart showing sound volume adjusting processing performed by the sound output device of the present invention.

Here, a description will be given of sound volume adjusting processing performed by the sound output device according to an embodiment of the present invention, by using the flow charts of FIGS. 2 and 3. The processing shown in FIG. 2, for example, starts to be performed when the power supply of the sound output device is activated. When the processing proceeds to a connector A in FIG. 2, the processing shifts to the processing flow shown in the flow chart of FIG. 3.

After the present processing is started, in step S110, the second detecting portion 14 starts to detect a rising edge of a sampling frequency and the like of an input signal received from the main decoder 2. When the rising edge is detected, the second detecting portion 14 detects the peak value or the effective value of each channel in step S120. Then, the second detecting portion 14 detects M1 from the peak value or the effective value of each channel, and records the detected M1 in the M1 recording portion 15.

Next, in step S130, the theoretical electric-power value converting portion 16 calculates the theoretical electric-power value required according to the peak value or the effective value of each channel. Furthermore, in step S140, the theoretical electric-power value converting portion 16 calculates W1 which is a value obtained by adding up the theoretical electric-power values of all the channels, and records the thus calculated W1 in the W1 recording portion 17.

Next, in step S150, the limit comparing portion 19 compares the limit B recorded in the limit recording portion 18 with W1 recorded in the W1 recording portion 17. Here, the limit B actually varies within a certain range, and thus, it is preferable to multiply the obtained value by a constant determined considering the variation.

If the comparison result is NOT "limit B<W1", the flow shifts to the processing flow of FIG. 3, which will be described later. If the comparison result is "limit B<W1", the DSP 1 checks the state of a DRC timer (not shown) in step S160. If the DSP 1 finds the DRC timer ON, the DSP 1 stops the DRC timer. What is used as the DRC timer is, for example, a software timer that operates by the DSP 1 executing a predetermined program.

Next, in step S170, the limit comparing portion 19 controls the mute control unit 13 to turn on a mute to stop the output of sound. Next, in step S180, the limit comparing portion 19 displays an alert on a predetermined screen to the effect that the sound volume is forcibly lowered to cope with over power. Incidentally, the alert may be displayed on, for example, a front panel of the sound output device, or, a monitor device or the like externally connected to the sound output device.

Next, in step S190, the volume control unit 12 lowers the sound volume to a level (a theoretically know value) where the total of outputs of all the channels is not larger than the limit A. Note that this volume adjustment is performed by using the theoretical output-limit value recorded in the theoretical value recording portion 20. When the sound volume adjustment is completed, the mute is cancelled to restart the reproduction of sound.

Figure 3:
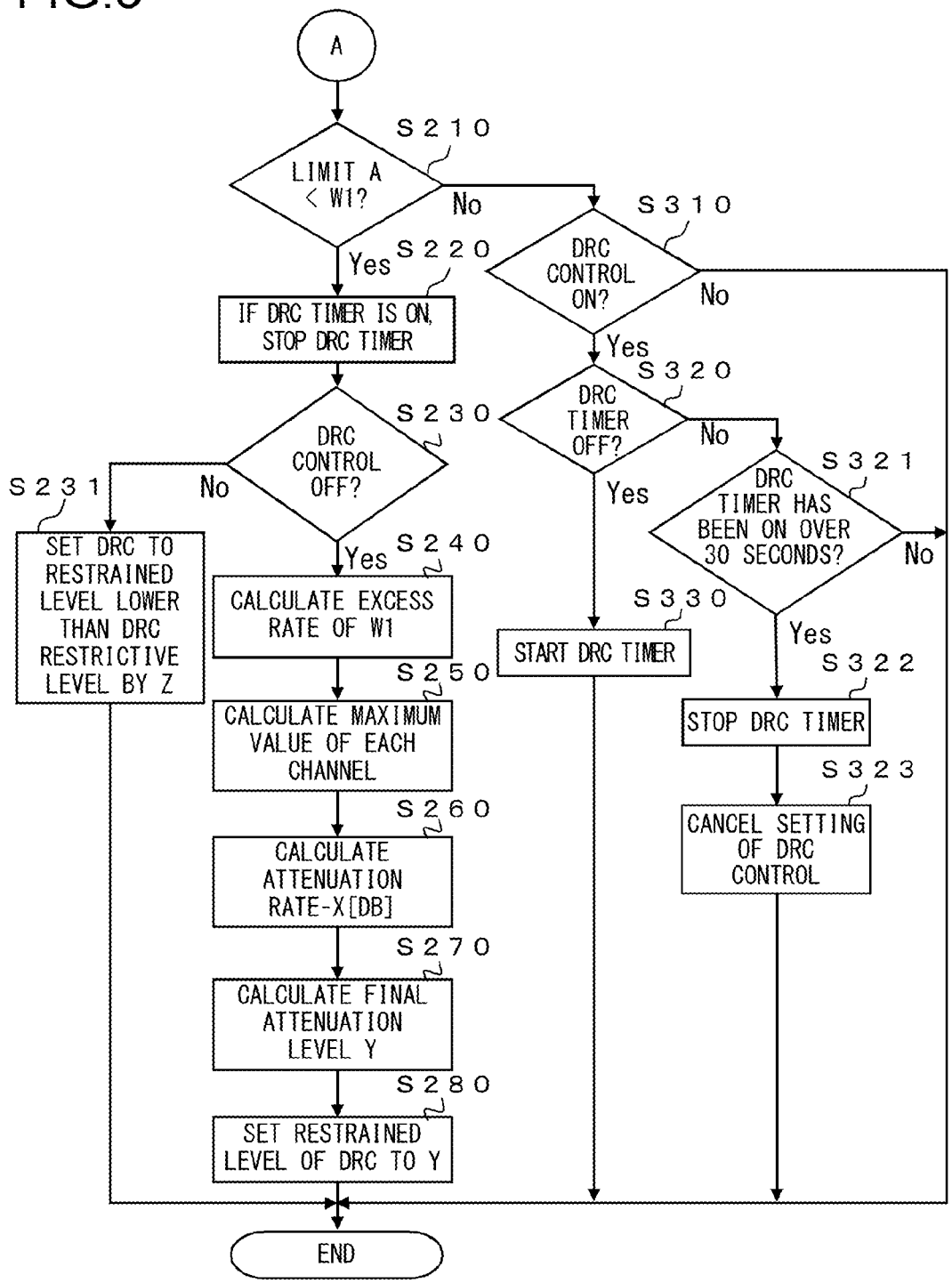
FIG. 3 is a flow chart showing the sound volume adjusting processing performed by the sound output device of the present invention.

Back to step S150, if the comparison result is NOT "limit B<W1", the flow shifts to the processing flow of FIG. 3. In FIG. 3, first, the limit comparing portion 19 compares the limit A with W1 in step S210. Here, a description will be given of processing performed in the case of "limit A<W1" first.

If "limit A<W1", the DSP 1 checks the state of the DRC timer in step S220. If the DSP 1 finds the DRC timer ON, the DSP 1 stops the DRC timer. Next, the DSP 1 checks whether the DRC control unit 11 is ON or OFF in step S230.

If the DRC control unit 11 is ON, the DRC control unit 11 is set to a restrictive level that is lower than a DRC restrictive level by a value Z (the value is set as necessary) in step S231, and then the present processing is finished. The finish of the present processing is followed by a stand-by state which continues until a next detection of a sampling frequency.

If the DRC control unit 11 is OFF, in step S240, the maximum output value comparing portion 21 calculates an excess rate of W1 by dividing W1 by the limit A. Next, in step S250, the second detecting portion 14 detects the maximum value M1 of the detected peak values or effective values of all the channels, and records M1 in the M1 recording portion 15.

Next, in step S260, the maximum output value comparing portion 21 calculates an attenuation rate −X [dB], which indicates a degree of attenuation between the above-detected M1 and the maximum value of the audio signal that is dealt with in the I2S format. The attenuation rate −X is an attenuation rate applied to the detected peak value or effective value based on the maximum output value of the DSP 1.

Next, in step S270, the maximum output value comparing portion 21 calculates a final attenuation level Y. As for the calculation of Y, it is done by subtracting a value Z, which is in accordance with the excess rate, from the above-obtained −X [dB]. For example, if the excess rate is 1.1 and Z=2, then, Y=−X−2 [dB]. The attenuation constant Z which is subtracted according to the excess rate is judged based on the state of the device, but, depending on the state of the device, the attenuation constant Z may be constantly set to a fixed value.

Next, in step S280, the maximum output value comparing portion 21 sets the restrictive level of the DRC control unit 11 to Y, and then finishes the present processing. Thereby, the measurement is continued with the current state maintained, and if W1 continues to be above the limit A, the above-described attenuation constant Z is further attenuated by the attenuation constant Z.

Back to step S210, in step S210, if W1 is found not to be larger than the limit A (NOT limit A<W1) in step S210, then in step S310, the DSP 1 checks whether the DRS control unit 11 is On or OFF.

If the DRC control unit 11 is OFF, the present processing is finished. If the DRC control unit 11 is ON, then in step S320, the DSP 1 judges whether the DRC timer is ON or OFF.

If the DRC timer is OFF, then in step S330, the DRC timer is made to start its operation, and then the present processing is finished. If the DRC timer is ON, then in step S321, it is judged whether or not the DRC timer has been ON longer than 30 seconds. The value of 30 seconds is just an example of the guideline time, and the guide line time may be appropriately adjusted according to the actual condition of each system.

If it is found that the DRC timer has been ON not longer than 30 seconds, the present processing is finished. If it is found that the DRC timer has been ON longer than 30 seconds, then in step S322, the DRC timer is made to stop its operation. Then, after the setting of the DRC control unit 11 is cancelled in step S323, the present processing is finished.

As has been described above, according to the present embodiment, when the limit A ceases to be exceeded, the state is maintained for 30 minutes, and thereafter, the DRC control unit 11 is released and the monitoring is continued.

As for formulae for calculating the various theoretical values, the theoretical values are able to be calculated by using the calculation methods listed in FIG. 4 or 5, but it should be noted that the theoretical values depends also on inner processing means of the DSP 1 and thus the formulae listed in FIGS. 4 and 5 are just reference examples. FIG. 4 shows examples of calculation methods of various theoretical values by using peak-value detection. FIG. 5 shows examples of calculation methods of various theoretical values by using effective-value detection.

If the DSP 1 has received an over-power/overheat signal, which is a protection signal, from the amplifier 3, it is preferable to give priority to a protection operation. However, if, in the state of the device, the protection level by the above protection system is constantly exceeds the protection level from the amplifier 3, priority may be given to the above system.

According to the present embodiment described above, since the control of sound over power is achieved by digital processing alone, it is possible to avoid problems that would occur in a control performed by using an analog device, that is, for example, a complex configuration of a feedback circuit and the like, and degradation of sound quality. Furthermore, the limit values are able to be easily changed by changing software.

Other Embodiments

Although the present invention has been described hereinbefore with preferred embodiments and examples, they are not meant to limit the present invention, and the present invention can be practiced with various modifications within the technical idea of the present invention.

Therefore, the present invention is also applicable to the following embodiment.

(A) The above embodiments deal with examples where the DSP 1, the main decoder 2, and the amplifier 3 are incorporated in the sound output device; however, the sound output device may incorporate just the DSP 1, and the main decoder 2 or the amplifier 3 may be externally connected to the sound output device.

What is claimed is:
1. A sound output device comprising:
    a detecting portion which is performed by a digital signal processor (DSP) and detects an output level of each of a plurality of channels included in a digital audio signal;
    an electric power obtaining portion which is performed by the DSP and obtains electric power according to the output level;
    a compressing portion which is performed by the DSP and performs compression of a dynamic range of the digital audio signal if a total of the electric power of the plurality of channels exceeds an allowable output threshold indicating an allowable output electric power of a power supply incorporated in the sound output device but does not exceed a protective threshold indicating a limit of a range of power under which the power supply is protected in a case of a complete short circuit of the power supply;
    a mute portion which is performed by the DSP and performs muting of the digital audio signal; and
    a sound volume adjusting portion which is performed by the DSP and adjusts output volume of the digital audio signal,
    wherein
    the output level detected by the detecting portion is an output level of the digital audio signal before the digital audio signal is input to the compressing portion;
    if the total exceeds the protective threshold, the mute portion performs the muting, and the sound volume adjusting portion adjusts the output volume of the digital audio signal; and
    the mute portion cancels the muting after adjustment of the output volume is completed.
2. The sound output device according to claim 1, wherein
    the compressing portion performs the compression if the electric power of at least one of the plurality of channels exceeds a threshold.

3. The sound output device according to claim 1, further comprising:
a calculating portion which is performed by the DSP and discriminates a maximum value of output levels of the plurality of channels, and calculates a first attenuation rate of the maximum value of the output levels with respect to a maximum value previously set according to a standard of the digital audio signal,
wherein
the compressing portion performs the compression based on an attenuation value obtained by subtracting a second attenuation rate, which is set previously, from the first attenuation rate.

4. The sound output device according to claim 3, wherein,
if the total exceeds the allowable output threshold after the compression, the compressing portion performs the compression by further subtracting the second attenuation rate from the attenuation value; and
the compressing portion stops the compression at an instant when a time period during which the total is smaller than the allowable output threshold exceeds a predetermined time period.

5. The sound output device according to claim 1, further comprising:
an audio decoder which decodes encoded audio data to generate the digital audio signal; and
an amplifier which amplifies the digital audio signal.

6. A sound output device comprising:
a detecting portion which is performed by a digital signal processor (DSP) and detects an output level of each of a plurality of channels included in a digital audio signal;
an electric power obtaining portion which is performed by the DSP and obtains electric power according to the output level;
a mute portion which is performed by the DSP and performs muting of a digital audio signal; and
a sound volume adjusting portion which is performed by the DSP and adjusts output volume of the digital audio signal,
wherein,
if a total of the electric power of the plurality of channels exceeds a protective threshold indicating a limit of a range of power under which a power supply incorporated in the sound output device is protected in a case of a complete short circuit of the power supply, the mute portion performs the muting and the sound volume adjusting portion adjusts the output volume of the digital audio signal; and
the mute portion cancels the muting after adjustment of the output volume is completed.

7. The sound output device according to claim 6, further comprising
a compressing portion which is performed by the DSP and performs compression of a dynamic range of the digital audio signal if a total exceeds an allowable output threshold indicating an allowable output electric power of the power supply incorporated in the sound output device but does not exceed the protective threshold.

8. The sound output device according to claim 7, further comprising
a calculating portion which is performed by the DSP and discriminates a maximum value of output levels of the plurality of channels, and calculates first attenuation rate of the maximum value of the output levels with respect to a maximum value previously set according to a standard of the digital audio signal,
wherein
the compressing portion performs the compression based on an attenuation value obtained by subtracting a second attenuation rate, which is set previously, from the first attenuation rate.

9. The sound output device according to claim 8, wherein,
if the total exceeds the allowable output threshold after the compression, the compressing portion performs the compression by further subtracting the second attenuation rate from the attenuation value; and
the compressing portion stops the compression at an instant when a time period during which the total is smaller than the first threshold exceeds a predetermined time length.

10. The sound output device according to claim 6, further comprising:
an audio decoder which decodes encoded audio data to generate the digital audio signal; and
an amplifier which amplifies the digital audio signal.

11. A sound output device, comprising:
a detecting portion which is performed by a digital signal processor (DSP) and detects an output level of each of a plurality of channels included in a digital audio signal;
an electric power obtaining portion which is performed by the DSP and obtains electric power according to the output level; and
a compressing portion which is performed by the DSP and performs compression of a dynamic range of the digital audio signal if the electric power of at least one of the channels exceeds a threshold;
a muter which is performed by the DSP and performs muting of the digital audio signal; and
a sound volume adjuster which is performed by the DSP and adjusts output volume of the digital audio signal,
wherein,
if the total exceeds the protective threshold, the muter performs the muting, and the sound volume adjuster adjusts the output volume of the digital audio signal; and
the muter cancels the muting after adjustment of the output volume is completed.

12. The sound output device according to claim 11, further comprising
a calculating portion which is performed by the DSP and discriminates a maximum value of output levels of the plurality of channels, and calculates a first attenuation rate of the maximum value of the output levels with respect to a maximum value previously set according to a standard of the digital audio signal,
wherein
the compressing portion performs the compression based on an attenuation value obtained by subtracting a second attenuation rate, which is set previously, from the first attenuation rate.

13. The sound output device according to claim 12, wherein,
if the total exceeds the allowable output threshold after the compression, the compressing portion performs the compression by further subtracting the second attenuation rate from the attenuation value; and
the compressing portion stops the compression at an instant when a time period during which the total is smaller than the allowable output threshold exceeds a predetermined time period.

14. The sound output device according to claim 11, further comprising:
an audio decoder which decodes encoded audio data to generate the digital audio signal; and
an amplifier which amplifies the digital audio signal.

* * * * *